(12) United States Patent
Josefosky et al.

(10) Patent No.: US 8,638,114 B2
(45) Date of Patent: Jan. 28, 2014

(54) TRANSFORMER WITHIN WAFER TEST PROBE

(75) Inventors: John T Josefosky, San Diego, CA (US); Yiwu Tang, San Diego, CA (US); Roger Hayward, Beaverton, OR (US)

(73) Assignee: QUALCOMM Incorporated, San Diego, CA (US)

( * ) Notice: Subject to any disclaimer, the term of this patent is extended or adjusted under 35 U.S.C. 154(b) by 756 days.

(21) Appl. No.: 12/633,661

(22) Filed: Dec. 8, 2009

(65) Prior Publication Data

US 2011/0133766 A1 Jun. 9, 2011

(51) Int. Cl.
*G01R 1/067* (2006.01)
*G01R 31/00* (2006.01)
*G01R 1/073* (2006.01)
*G01R 31/28* (2006.01)

(52) U.S. Cl.
CPC .......... *G01R 1/0735* (2013.01); *G01R 31/2831* (2013.01)
USPC ................................ 324/755.09; 324/762.05

(58) Field of Classification Search
None
See application file for complete search history.

(56) References Cited

U.S. PATENT DOCUMENTS

| | | | | |
|---|---|---|---|---|
| 5,519,582 | A * | 5/1996 | Matsuzaki | 361/783 |
| 6,180,445 | B1 * | 1/2001 | Tsai | 438/238 |
| 6,218,910 | B1 * | 4/2001 | Miller | 333/33 |
| 6,501,343 | B2 * | 12/2002 | Miller | 333/33 |
| 6,686,754 | B2 * | 2/2004 | Miller | 324/754.18 |
| 6,917,210 | B2 * | 7/2005 | Miller | 324/754.18 |
| 6,972,965 | B2 * | 12/2005 | Ravid et al. | 361/777 |
| 7,102,462 | B2 * | 9/2006 | Taniguchi et al. | 333/133 |
| 7,388,424 | B2 * | 6/2008 | Miller | 327/551 |
| 8,125,235 | B2 * | 2/2012 | Hung | 324/754.07 |
| 8,125,237 | B2 * | 2/2012 | Sellathamby et al. | 324/760.02 |
| 8,237,269 | B2 * | 8/2012 | Tang et al. | 257/734 |
| 2004/0150968 | A1 * | 8/2004 | Ravid et al. | 361/777 |
| 2005/0223543 | A1 | 10/2005 | Cohen et al. | |
| 2006/0124927 | A1 | 6/2006 | Groves et al. | |
| 2006/0145338 | A1 | 7/2006 | Dong | |
| 2006/0255817 | A1 | 11/2006 | Yamagishi | |
| 2008/0111226 | A1 | 5/2008 | White et al. | |
| 2009/0224780 | A1 | 9/2009 | Chao et al. | |
| 2009/0237099 | A1 | 9/2009 | Garabedian et al. | |
| 2010/0264951 | A1 | 10/2010 | Shioga et al. | |

FOREIGN PATENT DOCUMENTS

| | | |
|---|---|---|
| EP | 0917162 A2 | 5/1999 |
| EP | 1079458 A2 | 2/2001 |
| EP | 1845581 A2 | 10/2007 |
| JP | 2007178440 A | 7/2007 |
| TW | 200848742 A | 12/2008 |
| WO | 2008147803 A1 | 12/2008 |
| WO | 2009130737 A1 | 10/2009 |

OTHER PUBLICATIONS

International Search Report and Written Opinion—PCT/US2010/059570, ISA/EPO—Jul. 12, 2011.
Taiwan Search Report—TW099142972—TIPO—Mar. 26, 2013.

* cited by examiner

*Primary Examiner* — Paresh Patel
(74) *Attorney, Agent, or Firm* — William M. Hooks

(57) ABSTRACT

A wafer test probe for testing integrated circuitry on a die is disclosed. The wafer test probe includes a membrane core. The wafer test probe also includes circuitry within the membrane core. The circuitry within the membrane core includes at least one portion of an inductor. The wafer test probe further includes a probe tip.

33 Claims, 12 Drawing Sheets

TRANSFORMER WITHIN WAFER TEST PROBE

TECHNICAL FIELD

The present disclosure relates generally to communication systems. More specifically, the present disclosure relates to systems and methods for a transformer within a wafer test probe.

BACKGROUND

Wireless communication systems are widely deployed to provide various types of communication content such as voice, video, data, and so on. These systems may be multiple-access systems capable of supporting simultaneous communication of multiple terminals with one or more base stations.

A wireless communication device or a base station may include one or more integrated circuits. These integrated circuits may include analog and digital circuitry necessary for wireless communication. Such circuitry may include inductors and transformers.

Integrated circuits are often tested prior to packaging. Such testing may be performed prior to cutting a wafer into chips. With the use of automated testing equipment, extensive testing may be performed on each integrated circuit of each wafer. In some instances, circuitry necessary for the proper testing of an integrated circuit may not be available on the integrated circuit. Such circuitry may instead be located within the packaging. Improvements to testing equipment and testing methods may ensure the accurate testing of integrated circuitry.

DETAILED DESCRIPTION

Figure 1:
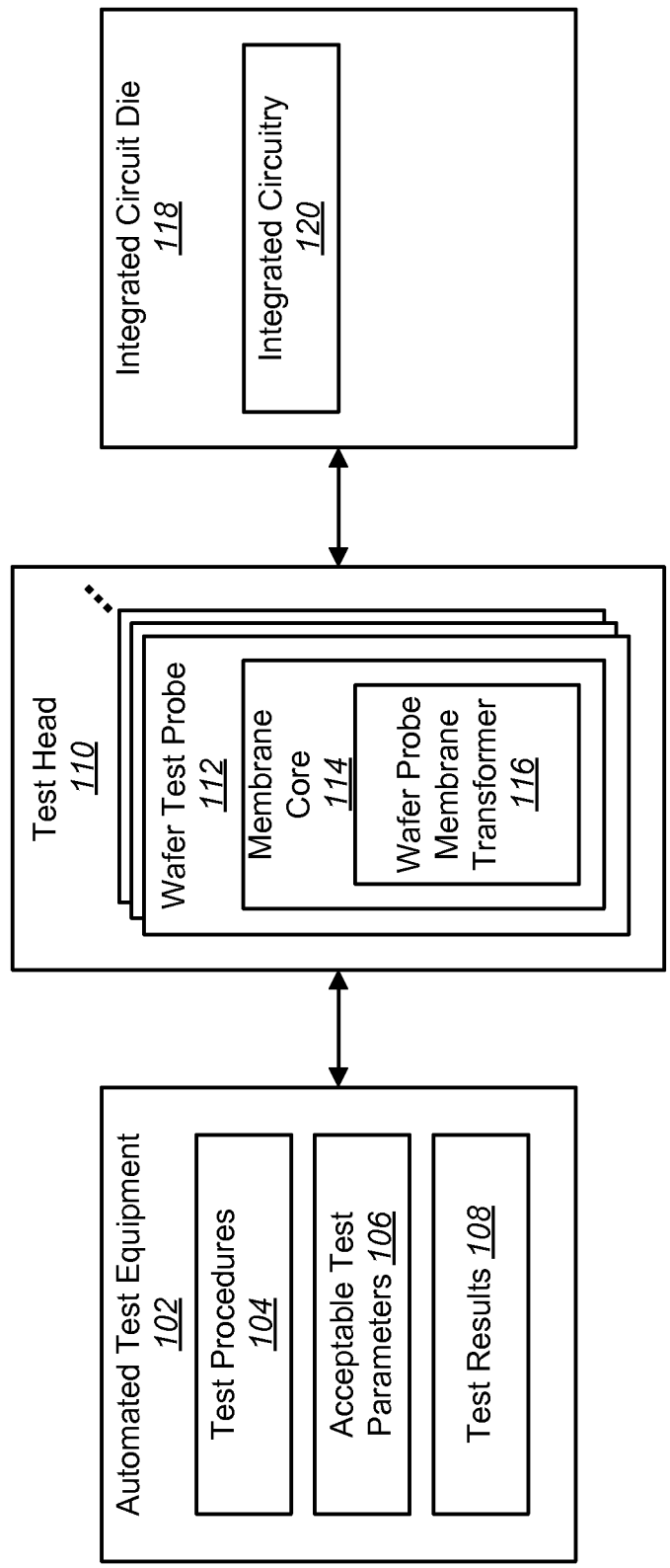
FIG. 1 is a block diagram illustrating wafer probe testing of integrated circuitry on an integrated circuit die of a wafer.

A wafer test probe for testing integrated circuitry on a die is disclosed. The wafer test probe includes a membrane core. The wafer test probe also includes circuitry within the membrane core that includes at least one portion of an inductor. The wafer test probe further includes a probe tip.

The membrane core may include a first layer of metal, a dielectric thin film, and a second layer of metal. The circuitry within the membrane core may be a transformer. The first layer of metal may be used to implement a first coil of the transformer and the second layer of metal may be used to implement a second coil of the transformer. The first layer of metal may be connected to the probe tip. The second layer of metal may be connected to the probe tip through a via and the first layer of metal. The circuitry within the membrane core may emulate circuitry included within a non-semiconductor substrate used in flip-chip packaging with the integrated circuitry on the die.

The probe tip may establish physical and electrical contact with the integrated circuitry on the die. The circuitry may include a transformer. Wafer probe inductor trimming may be used on the transformer to produce more accurate testing results.

The transformer may be formed using a ladder structure. The transformer may be formed using a 45 degree ladder structure. The wafer test probe may be on a test head. The test head may be connected to test equipment. The circuitry within the membrane core may be used as part of the testing of the integrated circuitry.

A method for testing integrated circuitry on a die is also described. One or more wafer test probes are provided. At least one of the wafer test probes includes a membrane core. At least a portion of a transformer is implemented within the membrane core. A test head is applied to the integrated circuitry on the die that includes the one or more wafer test probes. The integrated circuitry is tested using the one or more wafer test probes.

The integrated circuitry may be energized using the one or more wafer test probes. Applying the test head to the integrated circuitry on the die may include establishing physical contact between a probe tip of a wafer test probe and the integrated circuitry. Applying the test head to the integrated circuitry on the die may include establishing electrical contact between a probe tip of a wafer test probe and the integrated circuitry. Testing the integrated circuit using the one or more wafer test probes may include applying electrical signals to the integrated circuitry. The electrical signals may pass through the integrated circuitry to the at least a portion of a transformer and back to the integrated circuitry.

The membrane core may include a first layer of metal, a dielectric thin film, and a second layer of metal. The first layer of metal may be used to implement a first coil of the at least a portion of a transformer and the second layer of metal may be used to implement a second coil of the at least a portion of a transformer. The first layer of metal may be connected to a probe tip. The second layer of metal may be connected to a probe tip through a via and the first layer of metal. The at least a portion of the transformer may emulate circuitry included within a non-semiconductor substrate used in flip-chip packaging with the integrated circuitry on the die.

Wafer probe inductor trimming may be used on the at least a portion of a transformer to produce more accurate testing results. The at least a portion of a transformer may be formed using a ladder structure. The at least a portion of a transformer may be formed using a 45 degree ladder structure. The test head may be connected to test equipment.

An apparatus for testing integrated circuitry on a die is disclosed. The apparatus includes means for providing one or more wafer test probes that include a membrane core. At least a portion of a transformer is implemented within the membrane core. The apparatus also includes means for applying a test head to the integrated circuitry on the die. The test head includes the one or more wafer test probes. The apparatus further includes means for testing the integrated circuit using the one or more wafer test probes.

The apparatus may include means for energizing the integrated circuit using the one or more wafer test probes. The means for applying the test head to the integrated circuitry on the die may include means for establishing physical contact between a probe tip of a wafer test probe and the integrated circuit. The means for applying the test head to the integrated circuitry on the die may include means for establishing electrical contact between a probe tip of a wafer test probe and the integrated circuit.

The means for testing the integrated circuit using the one or more wafer test probes may include means for applying electrical signals to the integrated circuitry. The electrical signals may pass through the integrated circuitry to the transformer and back to the integrated circuitry. The membrane core may include a first layer of metal, a dielectric thin film, and a second layer of metal. The first layer of metal may be used to implement a first coil of the transformer and the second layer of metal may be used to implement a second coil of the transformer.

Radio frequency (RF) circuits such as transceivers found in wireless communication devices often involve inductors and transformers. For example, an RF circuit may use a balun for impedance matching. The inductors and transformers may be fabricated on semiconductor wafers. However, integrated transformer structures may have an undesirably low quality factor (Q). Integrated transformer structures may also have an undesirably low coupling coefficient. Integrated transformer structures may further occupy an undesirably large amount of integrated circuit die.

As an alternative to such integrated transformer structures, integrated circuit die may be flip-chip bonded to a non-semiconductor substrate. Flip-chip bonding is discussed in further detail below in relation to FIG. 2. In a flip chip package, circuit elements such as a transformer may be implemented within the non-semiconductor substrate. For example, in a four layer flip package, a transformer may be implemented with two layers of metal in the four layer non-semiconductor substrate. A first layer of metal, Metal1, may be used as the primary coil and a second layer of metal, Metal2, may be used as the secondary coil. All or part of a transformer may be implemented within the non-semiconductor substrate. The non-semiconductor substrate may then be attached to an integrated circuit. Using flip-chip bonding, additional integrated circuit die may be available. Furthermore, inductors and transformers implemented within the non-semiconductor substrate may have a high Q and an adequately high coupling coefficient k.

FIG. 1 is a block diagram illustrating wafer probe testing of integrated circuitry 120 on an integrated circuit die 118 of a wafer. The integrated circuitry 120 may be designed for use in a wireless device such as a base station, a wireless communication device, or the like. A base station may also be referred to as, and may include some or all of the functionality of, an access point, a broadcast transmitter, a Node B, an evolved Node B, etc. Each base station provides communication coverage for a particular geographic area. The term "cell" can refer to a base station and/or its coverage area depending on the context in which the term is used.

A wireless communication device may also be referred to as, and may include some or all of the functionality of, a terminal, an access terminal, a user equipment (UE), a subscriber unit, a station, a mobile device, etc. A wireless communication device may be a cellular phone, a personal digital assistant (PDA), a wireless device, a wireless modem, a handheld device, a laptop computer, etc. A wireless communication device may communicate with zero, one, or multiple base stations on the downlink (DL) and/or uplink (UL) at any given moment. The downlink (or forward link) refers to the communication link from a base station to the wireless communication device, and the uplink (or reverse link) refers to the communication link from the wireless communication device to the base station.

In wafer level testing, integrated circuitry 120 on a die 118 may be tested prior to cutting the wafer into chips and packaging the chips in ceramic or plastic. Wafer level testing may involve exercising and testing the performance and characteristics of integrated circuitry 120 while the integrated circuit 120 is part of a processed wafer of integrated circuits before the wafer has been scribed and cut to singular die. A test head 110 having many small wafer test probes 112 may be brought towards an integrated circuit 120 on the wafer such that the wafer test probes 112 make physical and electrical contact with microbumps on the integrated circuit 120. In one configuration, the wafer test probes 112 may make physical contact using an inverted socket structure. After the test head 110 and wafer test probes 112 have been made to physically and electrically contact the desired microbumps, the integrated circuit 120 may be energized and tested through the wafer test probes 112. The test head 110 and wafer test probes 112 may be attached to a circuit board (not shown) which is attached to test equipment 102.

The testing may be performed by automated test equipment 102. The automated test equipment 102 may perform test procedures 104 on the integrated circuitry 120 through the wafer test probes 112 on the test head 110. The automated test equipment 102 may also measure test results 108 through the wafer test probes 112 on the test head 110. The automated test equipment 102 may then compare the test results 108 with acceptable test parameters 106. The acceptable test parameters 106 may be based on testing of previous integrated circuitry. Based on the acceptable test parameters 106, the automated test equipment 102 may determine whether the integrated circuitry 120 meets testing requirements.

When using flip chip packaging, some of the circuitry necessary for proper function may be located in a non-semiconductor substrate. Thus, important circuit elements may be missing from the integrated circuitry 120 on the die 118. For example, a transformer may not exist in its entirety prior to the integrated circuit die 118 being flip-chip mounted on a substrate. Testing of the integrated circuitry 120 on the die 118 at wafer level may thus be unsuccessful. Only certain blocks of the die 118 may have important circuit elements missing. For example, a low noise amplifier (LNA) may use certain inductors to make the LNA oscillate. Some of the inductors may be in the non-semiconductor substrate.

To provide for successful wafer level testing, circuitry such as inductors and transformers which are implemented in the non-semiconductor substrate may also be implemented on the test head 110. In one configuration, part of an inductor may be implemented in a wafer test probe 112 to simulate the part of an inductor implemented in the non-semiconductor substrate. The other part of the inductor may be implemented in integrated circuitry 120 on the die 118.

The circuitry in a wafer test probe 112 may be implemented within a membrane core 114 of the wafer test probe 112. For example, a wafer probe membrane transformer 116 may be implemented in the membrane core 114 of a wafer test probe 112. As another example, inductors and baluns may be implemented in the membrane core 114 of a wafer test probe 112. In one configuration, only some of the wafer test probes 112 have additional circuitry. A wafer probe membrane transformer 116 may allow signal path RF performance to be measured during wafer probing.

Figure 2:
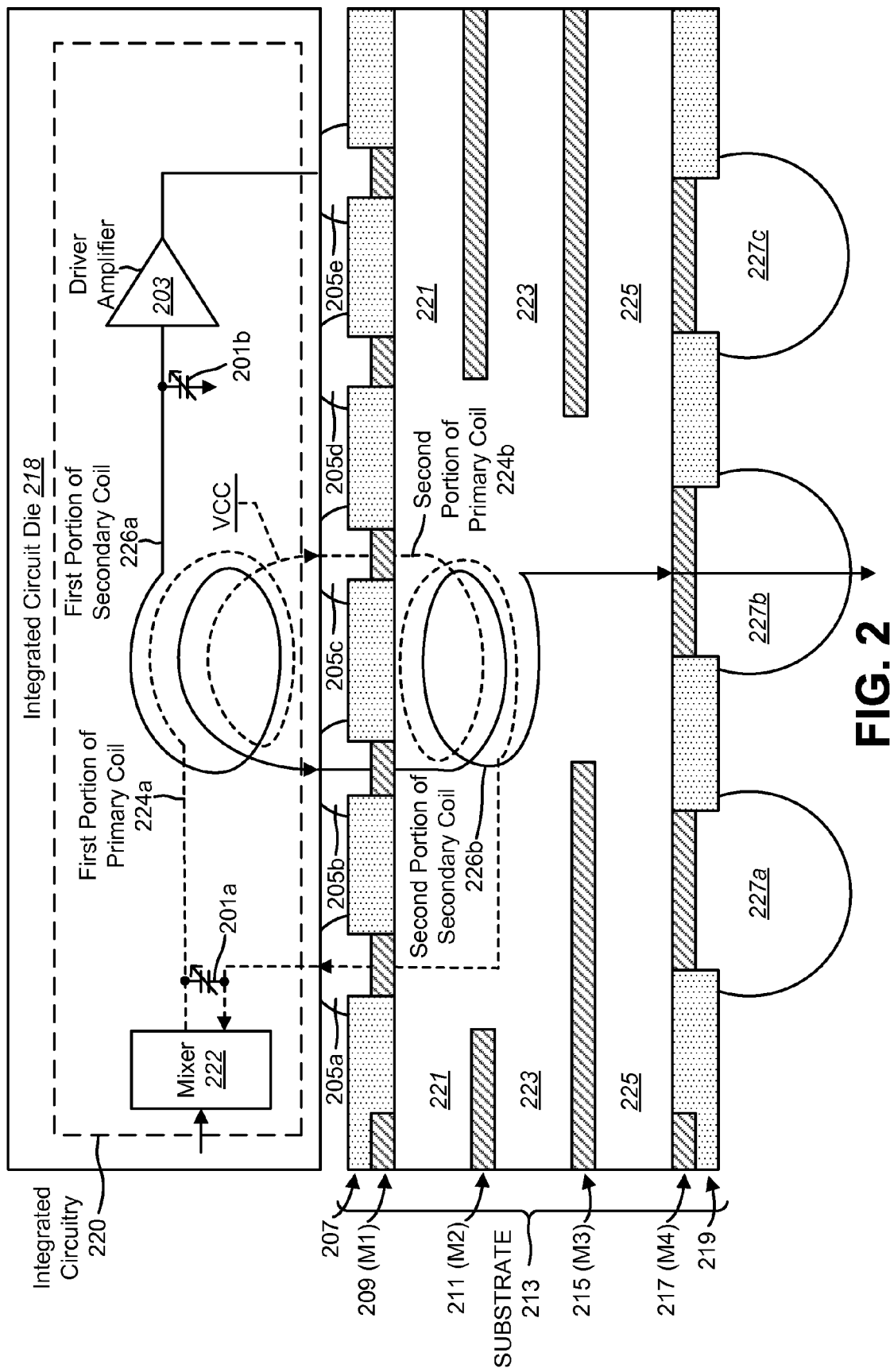
FIG. 2 is a simplified cross-sectional diagram of flip-chip packaging.

FIG. 2 is a simplified cross-sectional diagram of flip-chip packaging. An integrated circuit die 218 may be flip-chip packaged with a non-semiconductor substrate 213. In one configuration, integrated circuitry 220 on the integrated circuit die 218 may be an RF transceiver integrated circuit. The RF transceiver integrated circuit may be flip-chip mounted by a plurality of microbumps ("bumps") 205*a-e* to a non-semiconductor multi-layer substrate 213. The non-semiconductor substrate 213, in this example, is the substrate of a ball grid array (BGA) integrated circuit package. The substrate 213 is not a structure realized on a semiconductor wafer using semiconductor wafer fabrication steps. The substrate 213 does not include a substrate layer of single-crystal semiconductor wafer material. The non-semiconductor substrate 213, for example, may be a multi-layer laminated ceramic structure, a multi-layer pressed ceramic structure, a multi-layer laminated plastic structure or a multi-layer epoxy-resin structure such as FR4 fiberglass/epoxy-resin. Alternatively, other non-semiconductor substrate materials may be used.

In the present example, the non-semiconductor substrate 213 is a laminated structure and includes an epoxy-resin dielectric layer 223 that is 60 microns thick. Layer 223 is a material known by the tradename CCL-HL832 BT. The material is commercially available from Mitsubishi Gas and Chemical Company, Inc. of Tokyo, Japan. The "BT" refers to Bismalimide Triazine. The "CCL" indicates that it is copper-clad. The non-semiconductor substrate 213 may include two other 40 micron thick dielectric layers 221 and 225 as well as four 15 micron thick layers of copper interconnect 209, 211, 215, 217. Dielectric layers 221 and 225 may be a material known by the tradename HL830NX-A, available from Mitsubishi Gas and Chemical Company, Inc. of Tokyo, Japan. The top and bottom major surfaces of the non-semiconductor substrate 213 may include solder mask layers 207 and 219, respectively. Surface mount solder balls 227*a-c* may be attached to the metal interconnect layer 217 using multiple other flip-chip metal layers (not shown) including adhesion layers and barrier metal layers.

The integrated circuit die 218 may include integrated circuitry 220 such as a mixer 222, programmable variable capacitors 201*a-b*, and a driver amplifier 203. The integrated circuit die 218 may also include a transformer. The transformer may include a first coil. The first coil may be referred to as a primary coil 224. The integrated circuit die may also include a second coil. The second coil may be referred to as a secondary coil 226.

A first portion 224*a* of the primary coil 224 may be implemented in the integrated circuit die 218 and a second portion 224*b* of the primary coil 224 may be implemented in the non-semiconductor substrate 213. Likewise, a first portion 226*a* of the secondary coil 226 may be implemented in the integrated circuit die 218 and a second portion 226*b* of the secondary coil 226 may be implemented in the non-semiconductor substrate 213. Prior to the flip-chip mounting of the integrated circuit die 218 to the non-semiconductor substrate 213, the integrated circuit die 218 may not include the second portion 224*b* of the primary coil 224 and the second portion 226*b* of the secondary coil 226. Thus, testing of the integrated circuit die 218 prior to the flip-chip mounting of the integrated circuit die 218 to the non-semiconductor substrate 213 may fail.

As illustrated in FIG. 2, the second portion 224*b* of the primary coil 224 and the second portion 226*b* of the secondary coil 226 are disposed in the non-semiconductor substrate 213. The second portion 224*b* of the primary coil 224, which is within the non-semiconductor substrate 213, may be coupled through a solder ball 227*b* to a ground conductor (not shown) in an underlying printed circuit board to which the overall BGA package is attached within a wireless communication device. In one configuration, the BGA integrated circuit package may include a digital baseband integrated circuit, a power amplifier and other components. The integrated circuit die 218, as well as other integrated circuit die that are attached to the non-semiconductor substrate 213, may be encapsulated by another portion (not shown) of the BGA package.

Once the non-semiconductor substrate 213 has been attached to the integrated circuit die 218, wafer level testing of the integrated circuit die 218 may be difficult if not impossible. This is because nodes within the integrated circuit die 218 may be inaccessible to test equipment. Furthermore, wafer level testing is designed to test the integrated circuit die 218 prior to cutting the wafer into chips and packaging the chips. In flip-chip bonding, the non-semiconductor substrate 213 is attached to the integrated circuit die 218 as part of packaging the integrated circuit die 218. In addition, the use of flip-chip bonding may reduce the cost of a packaged device. For example, in one configuration the packaged device may include three die, one substrate, and the package. If the two lowest cost die have a low yield (~90%), it may not be cost effective to pass on the cumulative yield loss to the whole system.

Figure 3:
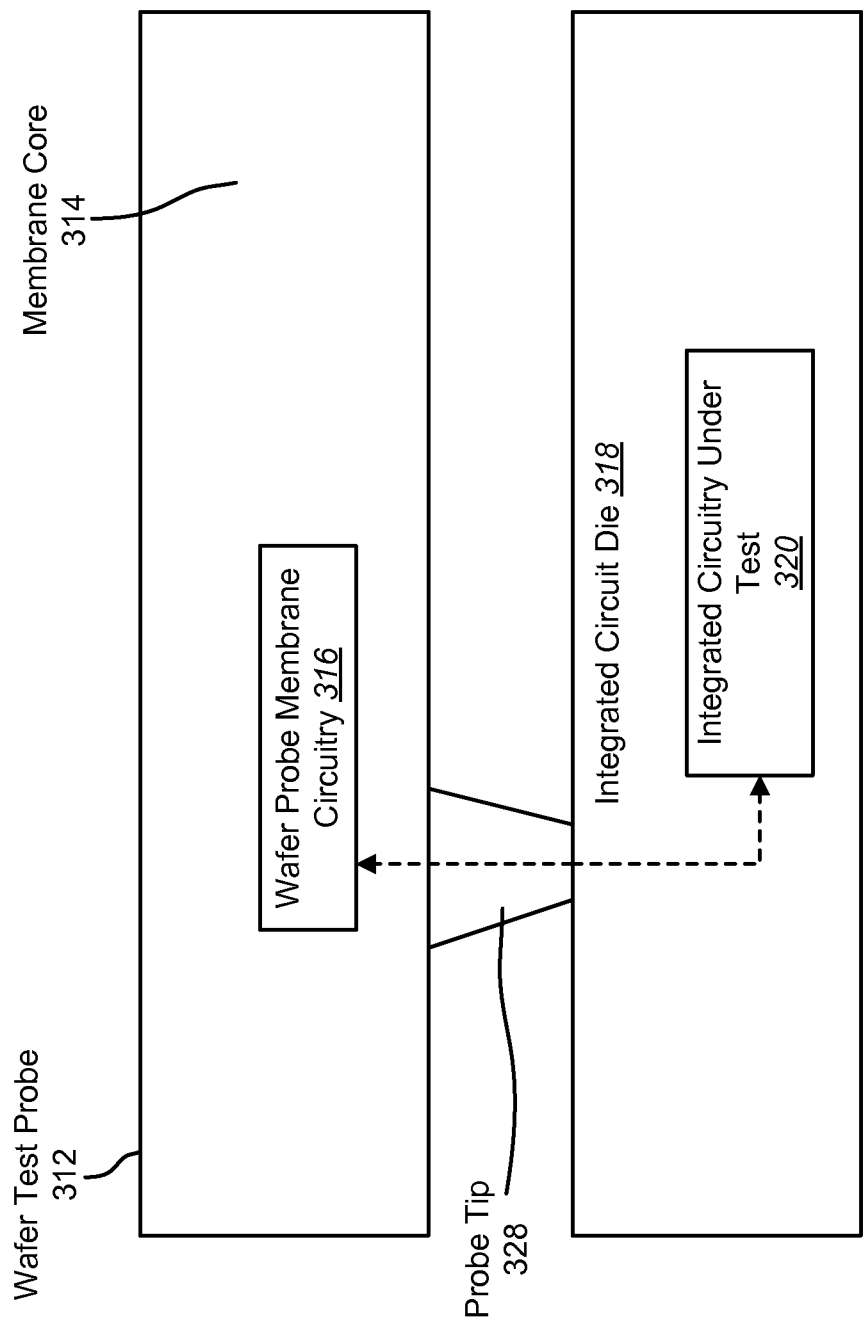
FIG. 3 illustrates testing of an integrated circuit die by a wafer test probe.

FIG. 3 illustrates testing of an integrated circuit die 318 by a wafer test probe 312. Multiple wafer test probes 312 may be included in a test head 110. The wafer test probe 312 may include a membrane core 314. The membrane core 314 may include a dielectric film. The wafer test probe 312 may include wafer probe membrane circuitry 316 within the membrane core 314. The wafer probe membrane circuitry 316 may include inductors and transformers. The wafer probe membrane circuitry 316 may also include portions of inductors and/or transformers.

The wafer test probe 312 may establish physical and electrical contact with the integrated circuit die 318 via one or more probe tips 328. The probe tips 328 may allow interaction between the wafer test probe 312 and the integrated circuit die 318. For example, the probe tip 328 may facilitate testing of integrated circuitry 320 under test on the integrated circuit die 318.

The testing of the integrated circuitry 320 may include applying electrical signals to the integrated circuitry 320. These electrical signals may pass through the integrated circuitry 320 to the wafer probe membrane circuitry 316 and back to the integrated circuitry 320. In other words, the wafer probe membrane circuitry 316 may be used as part of the testing of the integrated circuitry 320.

Figure 4:
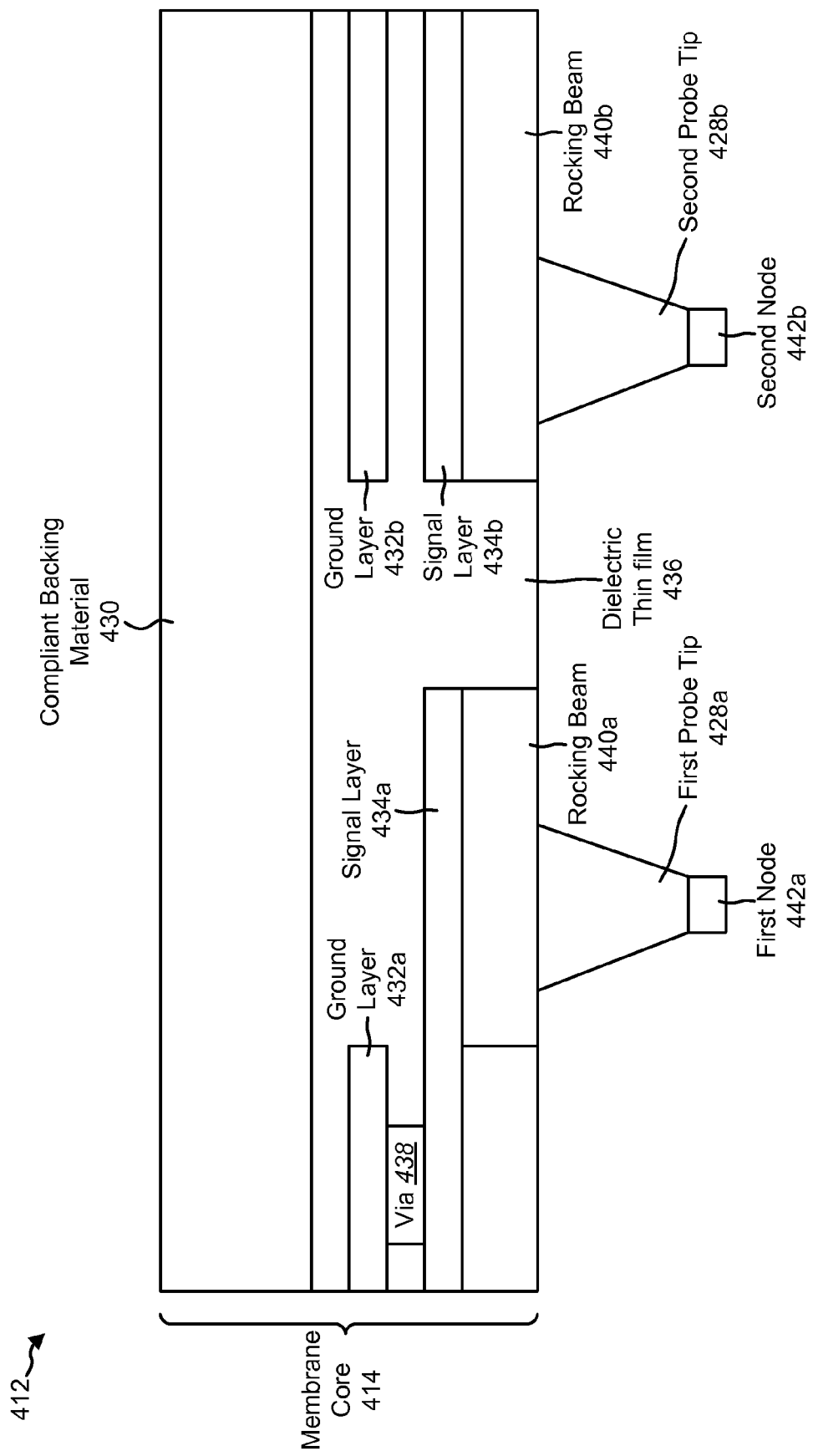
FIG. 4 illustrates a structure of a wafer test probe for use in the present systems and methods.

FIG. 4 illustrates a structure of a wafer test probe 412 for use in the present systems and methods. The wafer test probe 412 of FIG. 4 may be one configuration of the wafer test probe 112 of FIG. 1. The wafer test probe 412 may include a membrane core 414. The membrane core 414 may include a first probe tip 428*a* and a second probe tip 428*b*. As discussed above, a probe tip 428 may facilitate testing of an integrated circuit die 318. Although only two probe tips 428 are shown, a wafer test probe 412 may include hundreds or thousands of probe tips 428.

The membrane core 414 may include a first layer of metal. The first layer of metal may be referred to as a signal layer 434. The membrane core 414 may include a second layer of metal. The second layer of metal may be referred to as a ground layer 432. The signal layer 434 and the ground layer 432 may be separated by a dielectric thin film 436.

A transformer may be implemented within the membrane core 414 using the signal layer 434 and the ground layer 432. For example, a transformer may be implemented using the signal layer 434 as the primary coil 224 and the ground layer 432a-b as the secondary coil 226. The transformer may be designed such that key parameters of the transformer match those of the package transformer. In other words, the parameters of the transformer may be set to emulate the parameters of the circuit components included within the non-semiconductor substrate 213. For example, the inductance L1 of a primary coil within the membrane core 414, the inductance L2 of a secondary coil within the membrane core 414 and the coupling coefficient k of the primary coil and the secondary coil may be matched with the parameters of the circuit components included within the non-semiconductor substrate 213. L1 and L2 may have an impact on the transformer tank resonant frequency. The coupling coefficient k may have an impact on the transformer tank resonant frequency and the transformer gain.

In one configuration, the ground layer 432a may be connected to the first probe tip 428a through a via 438 from the ground layer 432a to the signal layer 434a and through the signal layer 434a to the first probe tip 428a. The first probe tip 428a may then provide an electrical connection with a first node 442a on an integrated circuit die 318. If the ground layer 432a is used to implement the secondary coil of a transformer, the secondary coil may thus be electrically connected with the first node 442a of the integrated circuit 320 through the first probe tip 428a.

In one configuration, the signal layer 434b may be connected to the second probe tip 428b. The second probe tip 428b may provide an electrical connection with a second node 442b on the integrated circuit die 418. If the signal layer 434b is used to implement the primary coil of a transformer, the primary coil may thus be electrically connected to the second node 442b of the integrated circuit 420 through the second probe tip 428b.

Each probe tip 428 may be connected to a rocking beam 440a-b. The rocking may refer to the part of the wafer test probe 412 that connects the probe tip 428 to the trace on the membrane core 414. The rocking beam 440 may be part of the membrane core 414. The wafer test probe 412 may further include a compliant backing material 430. The compliant backing material 430 may act as a spring to the rocking beam 440.

Figure 5:
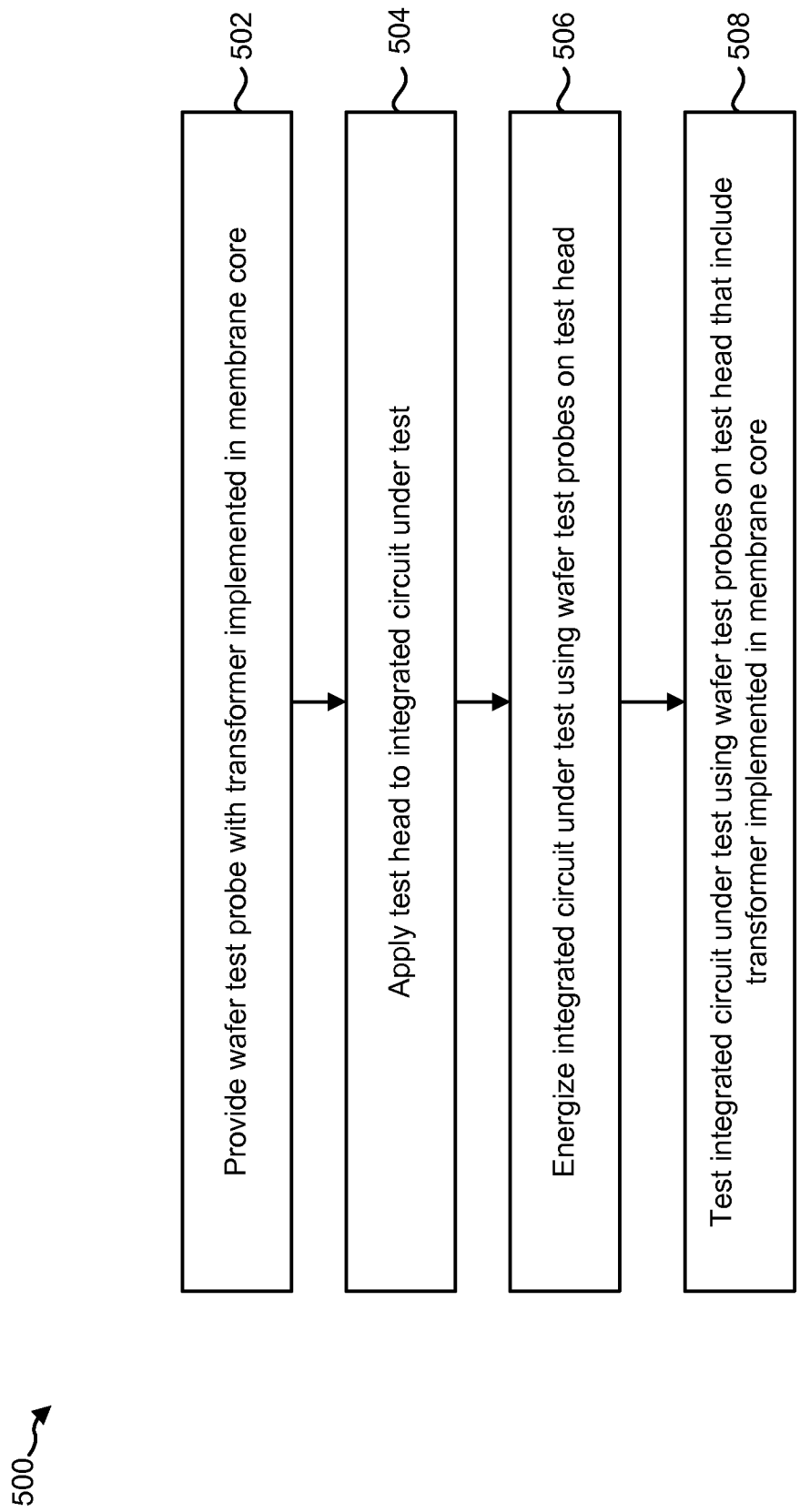
FIG. 5 is a flow diagram of a method for testing integrated circuitry on a die using a wafer test probe with a transformer implemented in the membrane core.

FIG. 5 is a flow diagram of a method 500 for testing integrated circuitry 120 on a die 118 using a wafer test probe 112 with a transformer 116 implemented in the membrane core 114. A wafer test probe 112 with a transformer 116 implemented in the membrane core 114 of the wafer test probe 112 may be provided 502. In one configuration, only a portion of a transformer 116 may be implemented in the membrane core 114. Multiple transformers 116 may be implemented within the membrane core 114. Each transformer 116 may include two or more inductors. In one configuration, the transformer 116 may be a balun.

A test head 110 may be applied 504 to an integrated circuit 120 under test. The test head 110 may include one or more wafer test probes 112. The integrated circuit 120 under test may next be energized 506 using the wafer test probes 112 on the test head 110. The integrated circuit 120 under test may then be tested 508 using the wafer test probes 112 on the test head 110 that include the transformer 116 implemented in the membrane core 114. The testing 508 may include automated testing. Examples of test procedures 104 include mixed signal testing, frequency testing and analog-to-digital converter (ADC) testing.

Figure 6:
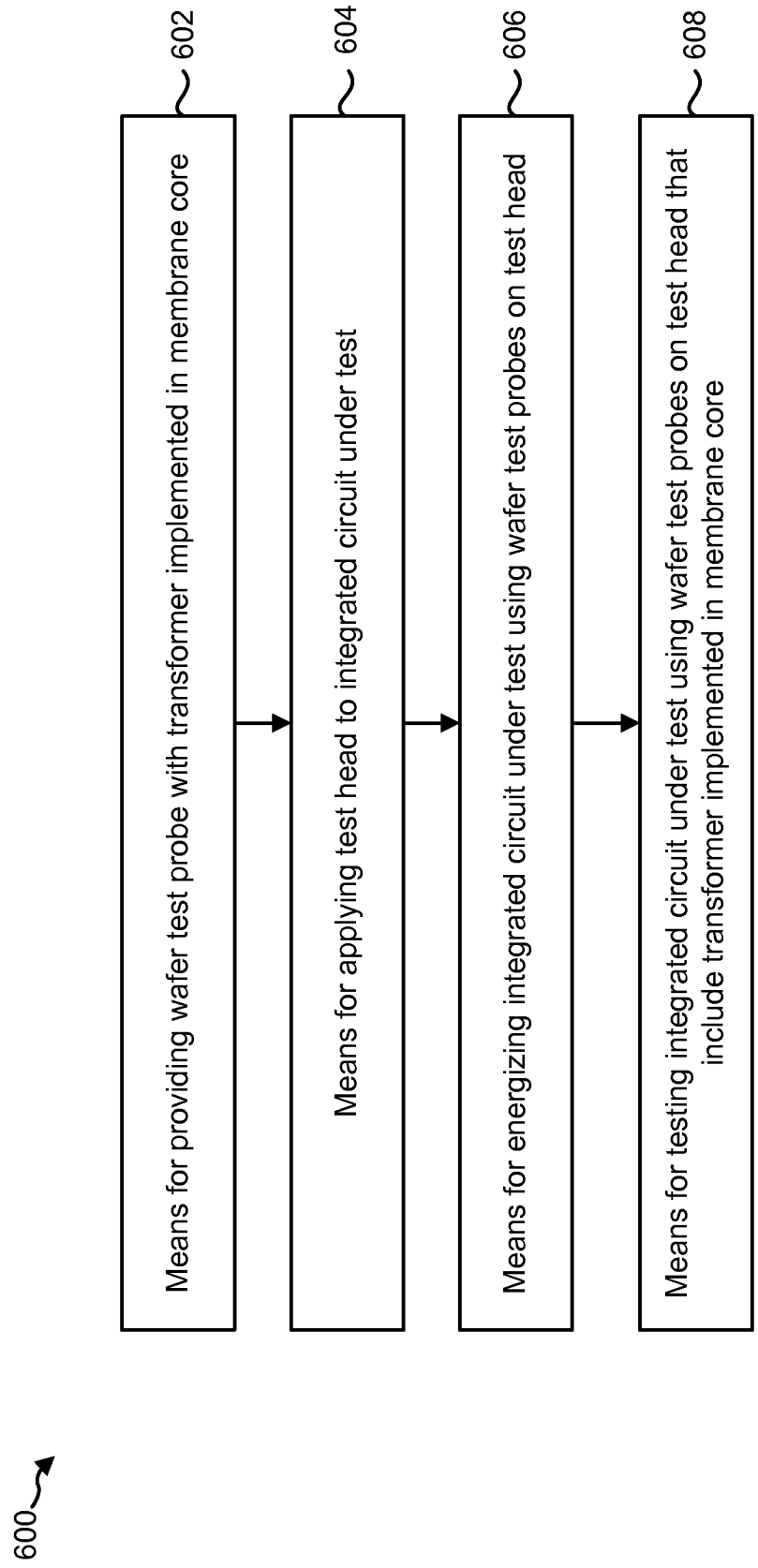
FIG. 6 illustrates means-plus-function blocks corresponding to the method of FIG. 5.

The method 500 of FIG. 5 described above may be performed by various hardware and/or software component(s) and/or module(s) corresponding to the means-plus-function blocks 600 illustrated in FIG. 6. In other words, blocks 502 through 508 illustrated in FIG. 5 correspond to means-plus-function blocks 602 through 608 illustrated in FIG. 6.

Figure 7:
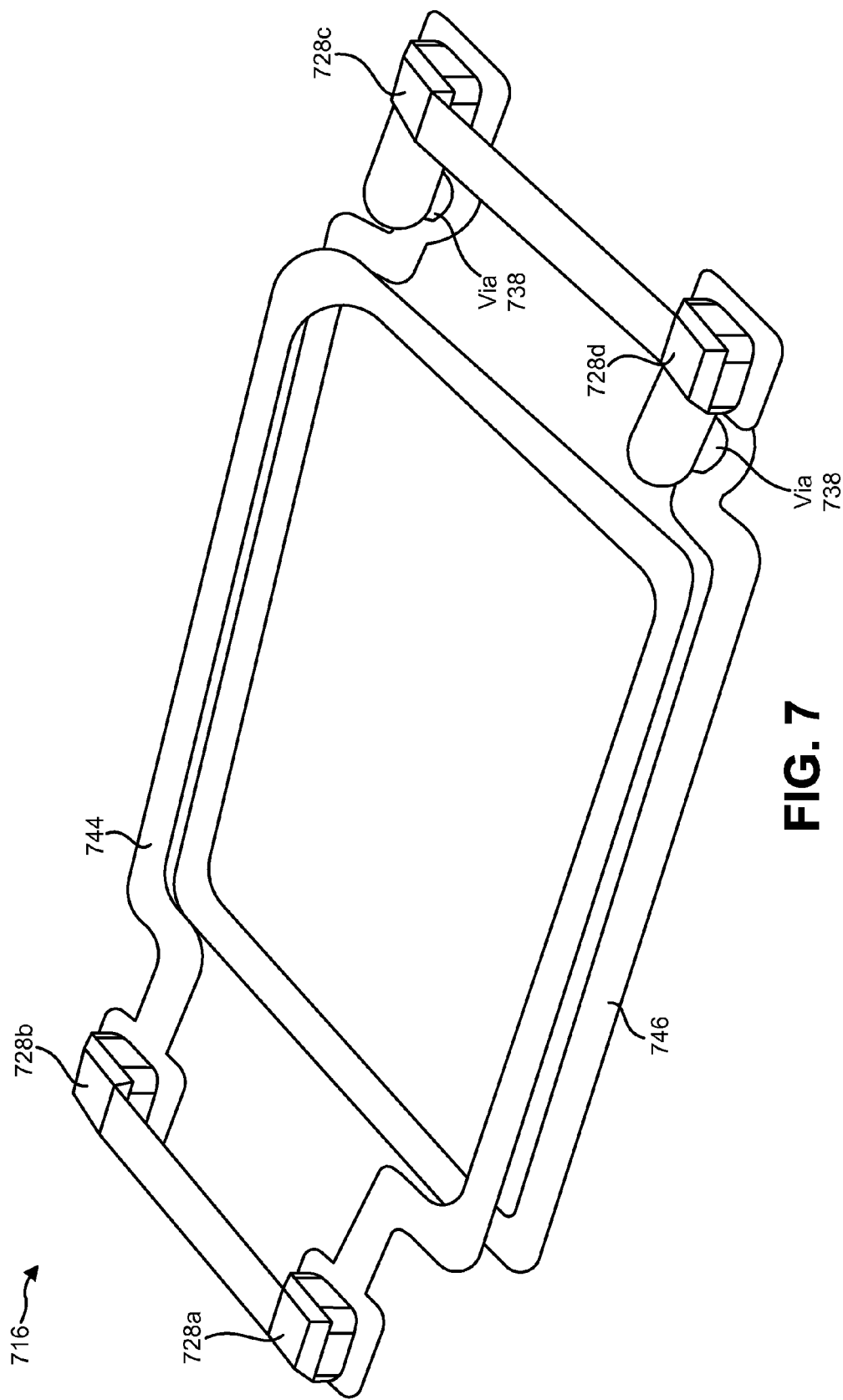
FIG. 7 illustrates one layout configuration of a wafer probe membrane transformer.

FIG. 7 illustrates one layout configuration of a wafer probe membrane transformer 716. The wafer probe membrane transformer 716 of FIG. 7 may be one configuration of the wafer probe membrane transformer 116 of FIG. 1. The wafer probe membrane transformer 716 may be designed for use in RF circuitry. The wafer probe membrane transformer 716 may be implemented within a membrane core 114 of a wafer test probe 112. The wafer probe membrane transformer 716 may include a primary coil 744 and a secondary coil 746. The primary coil 744 may be implemented using a first layer of metal (Metal1). As discussed above in relation to FIG. 4, the first layer of metal may be referred to as the signal layer 434. The secondary coil 746 may be implemented using a second layer of metal (Metal2). As discussed above in relation to FIG. 4, the second layer of metal may be referred to as the ground layer 432. The terminals of the primary coil 744 may contact wafer bumps on an integrated circuit 120 under test through probe tips 728a-b. The terminals of the secondary coil 746 may pass through vias 738 to the first layer of metal and then contact the wafer bumps through probe tips 728c-d.

Using the layout illustrated in FIG. 7 with a frequency of 2.5 gigahertz (GHz), the inductance L1 of the primary coil 744 may be 1.0 nanohenry (nH) with a quality factor Q1 of 13.91. The inductance L2 of the secondary coil 746 may be 1.09 nH with a Q of 13.90. The coupling coefficient k may be 0.41.

Figure 8:
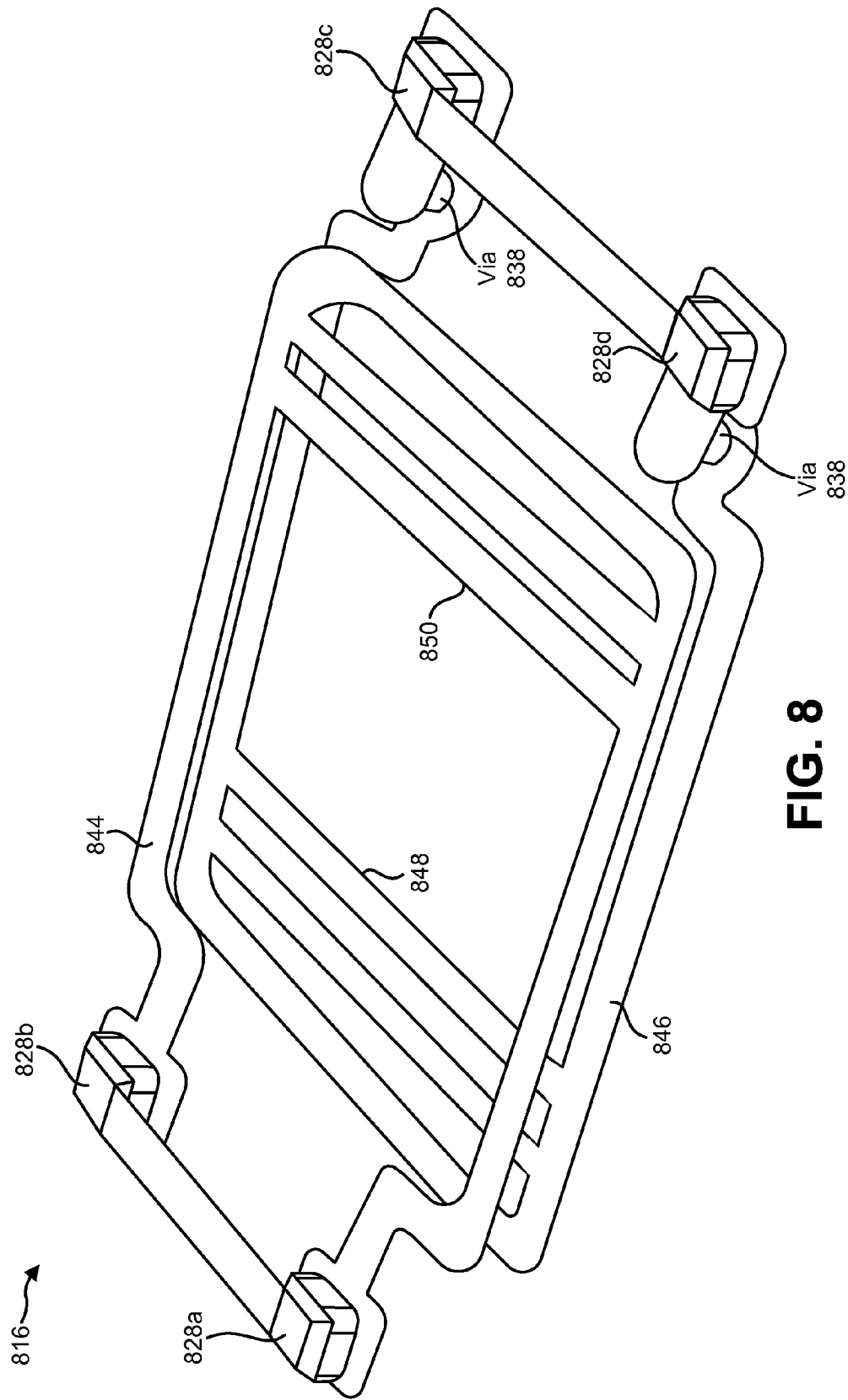
FIG. 8 illustrates a layout configuration of a wafer probe membrane transformer configured for wafer probe inductor trimming.

FIG. 8 illustrates a layout configuration of a wafer probe membrane transformer 816 configured for wafer probe inductor trimming. The wafer probe membrane transformer 816 of FIG. 8 may be one configuration of the wafer probe membrane transformer 116 of FIG. 1. The wafer probe membrane transformer 816 may be implemented within a membrane core 114 of a wafer test probe 112. When testing integrated circuitry 120 on a die 118 using a wafer probe membrane transformer 816, the inductance L1 of a primary coil 844, the inductance L2 of a secondary coil 846 and the coupling coefficient k may impact the transformer tank resonant frequency. The coupling coefficient k may also impact the gain of the transformer. Wafer probe inductor trimming may allow the fine tuning of L1, L2 and k which may lead to more accurate testing results.

The wafer probe membrane transformer 816 may include a primary coil 844 and a secondary coil 846. The primary coil 844 may be implemented using a first layer of metal and the secondary coil 846 may be implemented using a second layer of metal. As discussed above in relation to FIG. 4, the first layer of metal may be referred to as the signal layer 434 and the second layer of metal may be referred to as the ground layer 432.

The terminals of the primary coil 844 may contact wafer bumps on an integrated circuit 120 under test through probe tips 828a-b. The terminals of the secondary coil 846 may pass through vias 838 to the first layer of metal and then contact the wafer bumps through probe tips 828c-d. Both the primary coil 844 and the secondary coil 846 may use a ladder structure 848, 850 for wafer probe inductor trimming. By cutting rungs consecutively from inner loops, the inductance of a coil in the transformer 816 may increase in succession. Lasers may be used to cut rungs from the inner loops. The use of a ladder structure 848, 850 may allow the independent trimming of L1, L2 and k. Furthermore, a ladder structure 848, 850 may allow L1, L2 and k to be trimmed with a wider range. Trimming schemes may make probe development faster and more cost efficient.

Figure 9:
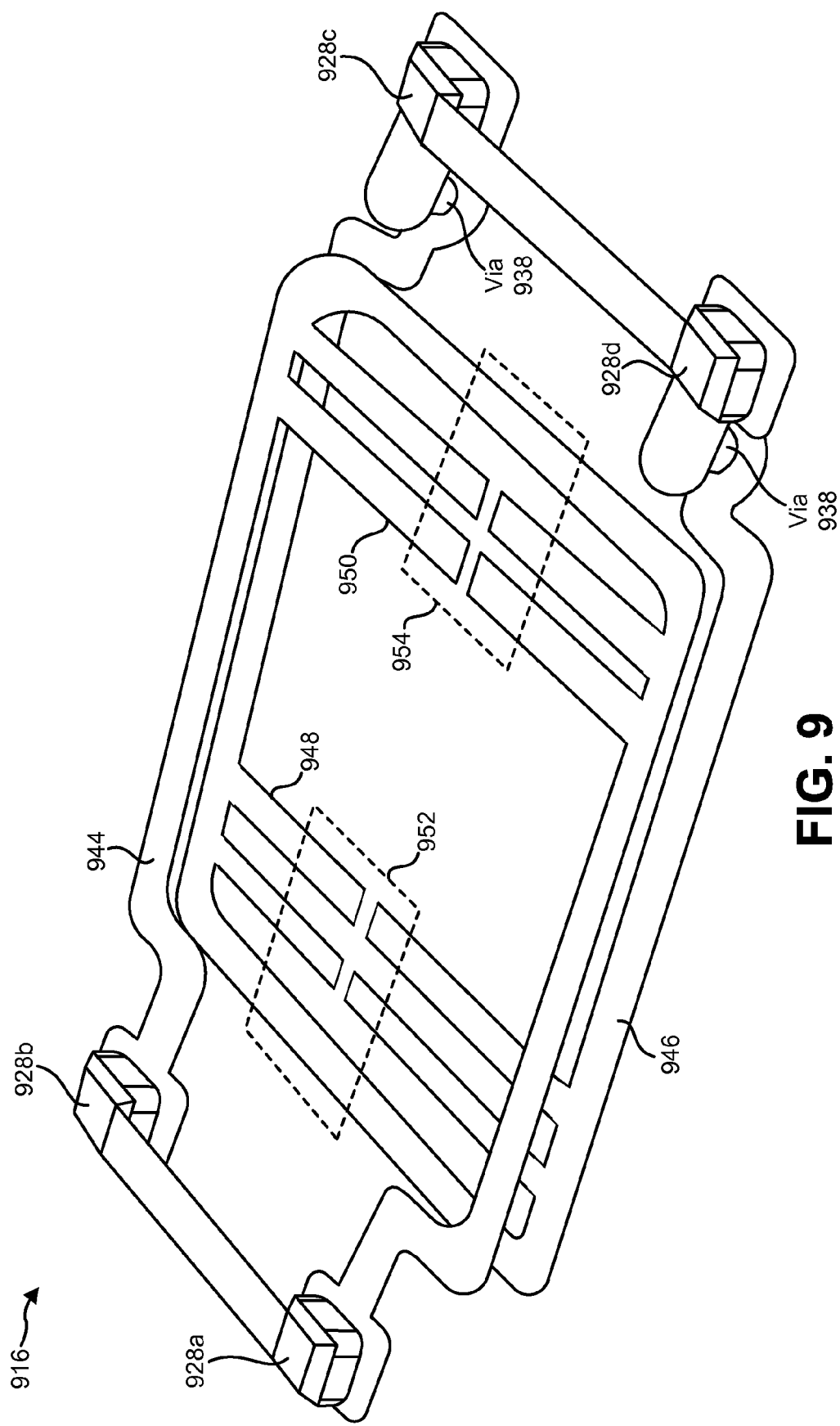
FIG. 9 illustrates a layout configuration of a wafer probe membrane transformer after trimming.

FIG. 9 illustrates a layout configuration of a wafer probe membrane transformer 916 after trimming. The wafer probe membrane transformer 916 of FIG. 9 may be one configuration of the wafer probe membrane transformer 116 of FIG. 1. The wafer probe membrane transformer 916 may include a primary coil 944 and a secondary coil 946. The primary coil 944 may be implemented using a first layer of metal and the secondary coil 946 may be implemented using a second layer of metal. As discussed above in relation to FIG. 4, the first layer of metal may be referred to as the signal layer 434 and the second layer of metal may be referred to as the ground layer 432.

The terminals of the primary coil 944 may contact wafer bumps on an integrated circuit 120 under test through probe tips 928a-b. The terminals of the secondary coil 946 may pass through vias 938 to the first layer of metal and then contact the wafer bumps through probe tips 928c-d. By removing small pieces of a coil from the inner to outer loops, the inductance may be increased. For example, two pieces 954 have been removed from the inner to outer loops of the ladder structure 950 of the primary coil 944 and two pieces 952 have been removed from the inner to outer loops of the ladder structure 948 the secondary coil 946.

The inductance L1 of the primary coil 944 may increase when the pieces 954 are removed. For example, the inductance L1 may be 0.94 nH before any pieces have been removed and 1.11 nH after the two pieces 954 have been removed. The trimming of the primary coil 944 may adjust the value of L1 while L2 and the coupling coefficient k remain constant.

The inductance L2 of the secondary coil 946 may likewise increase when pieces 952 of the secondary coil 946 are removed. The coupling coefficient k may remain relatively constant when trimming occurs. For example, the coupling coefficient k may be 0.41 prior to trimming the primary coil 944 and 0.42 after trimming has occurred.

Figure 10:
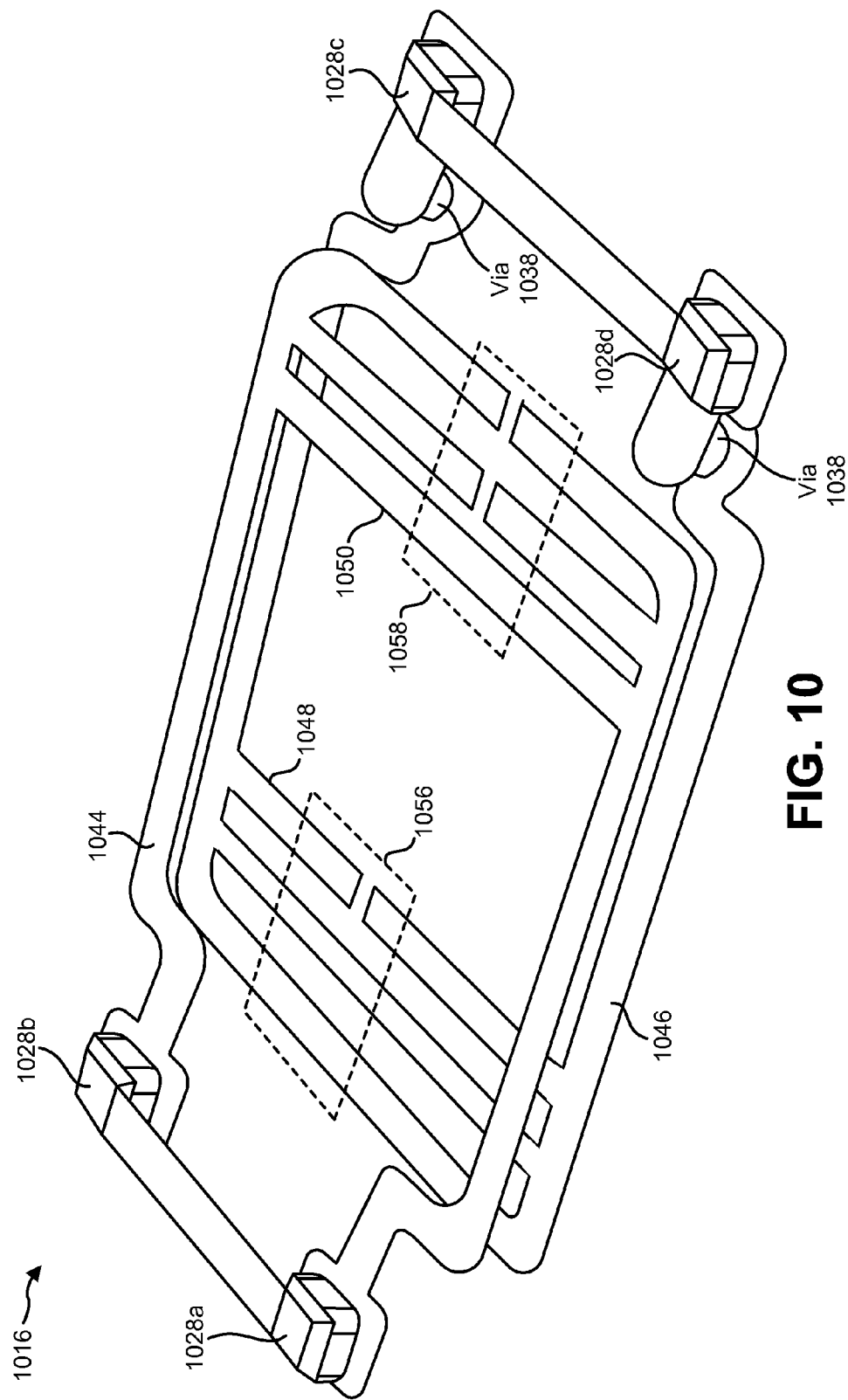
FIG. 10 illustrates another layout configuration of a wafer probe membrane transformer after trimming.

FIG. 10 illustrates another layout configuration of a wafer probe membrane transformer 1016 after trimming. The wafer probe membrane transformer 1016 of FIG. 10 may be one configuration of the wafer probe membrane transformer 116 of FIG. 1. The wafer probe membrane transformer 1016 may include a primary coil 1044 and a secondary coil 1046. The primary coil 1044 may be implemented using a first layer of metal and the secondary coil 1046 may be implemented using a second layer of metal. As discussed above in relation to FIG. 4, the first layer of metal may be referred to as the signal layer 434 and the second layer of metal may be referred to as the ground layer 432.

The terminals of the primary coil 1044 may contact wafer bumps on an integrated circuit 120 under test through probe tips 1028a-b. The terminals of the secondary coil 1046 may pass through vias 1038 to the first layer of metal and then contact the wafer bumps through probe tips 1028c-d.

To adjust the coupling coefficient k, both the primary coil 1044 and the secondary coil 1046 may be trimmed. For example, two pieces 1058 have been removed from the outer to inner loops of the ladder structure 1050 of the primary coil 1044 and one piece 1056 has been removed from the inner to outer loops of the ladder structure 1048 the secondary coil 1046.

The ladder structure 1048 for the wafer probe membrane transformer 1016 may be designed such that one inner loop has an inductance approximately equal to two outer loops in parallel. However, the outer loops may generate a much larger coupling coefficient k due to more overlap between the primary coil 1044 and the secondary coil 1046. The coupling coefficient k may vary by 30% or more by trimming a combination of the primary coil 1044 and the secondary coil 1046.

Figure 11:
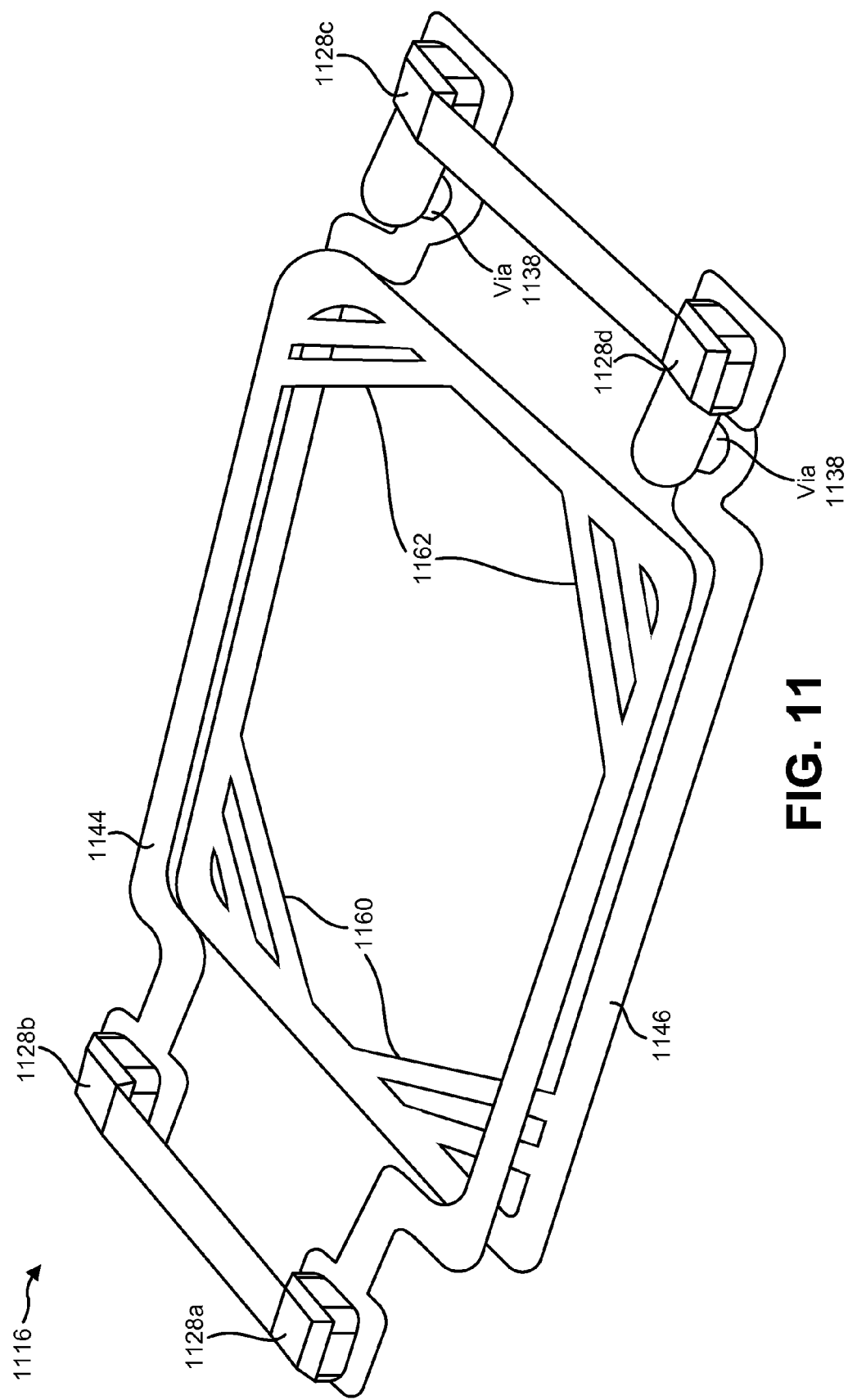
FIG. 11 illustrates an additional layout configuration of a wafer probe membrane transformer.

FIG. 11 illustrates an additional layout configuration of a wafer probe membrane transformer 1116. The wafer probe membrane transformer 1116 of FIG. 11 may be one configuration of the wafer probe membrane transformer 116 of FIG. 1. The wafer probe membrane transformer 1116 may include a primary coil 1144 and a secondary coil 1146. The primary coil 1144 may be implemented using a first layer of metal and the secondary coil 1146 may be implemented using a second layer of metal. As discussed above in relation to FIG. 4, the first layer of metal may be referred to as the signal layer 434 and the second layer of metal may be referred to as the ground layer 432.

The terminals of the primary coil 1144 may contact wafer bumps on an integrated circuit 120 under test through probe tips 1128a-b. The terminals of the secondary coil 1146 may pass through vias 1138 to the first layer of metal and then contact the wafer bumps through probe tips 1128c-d. The wafer probe membrane transformer 1116 may use a 45 degree ladder structure 1162 for the primary coil 1144 and a 45 degree ladder structure 1160 for the secondary coil 1146. The 45 degree ladder structures 1160, 1162 may allow more flexibility in trimming parameters. By cutting one or both rungs of the 45 degree ladder structure 1160, 1162 for each loop, finer steps may be achieved in L1, L2 and k adjustment.

Figure 12:
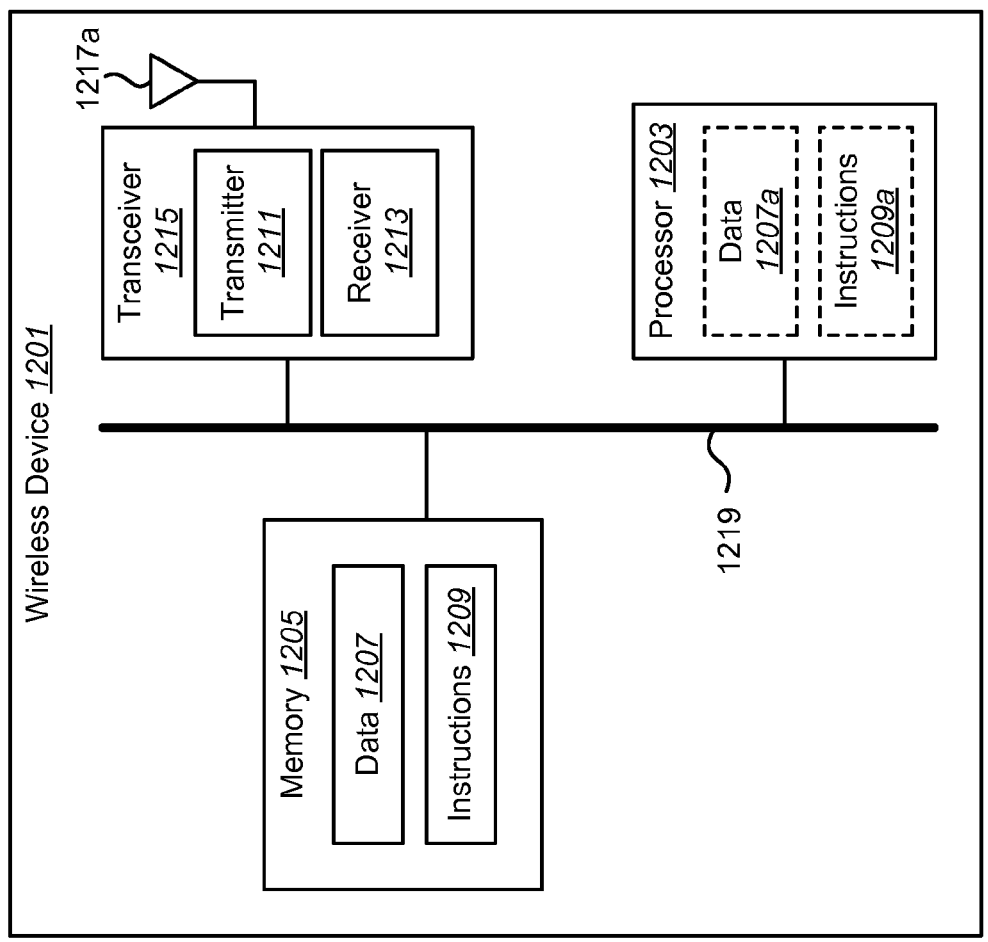
FIG. 12 illustrates certain components that may be included within a wireless device.

FIG. 12 illustrates certain components that may be included within a wireless device 1201. The wireless device 1201 may be a wireless communication device or a base station and may implement the present systems and methods as disclosed herein.

The wireless device 1201 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the wireless device 1201 of FIG. 12, in an alternative configuration, a combination of processors (e.g., an ARM and DSP) could be used.

The wireless device 1201 also includes memory 1205. The memory 1205 may be any electronic component capable of storing electronic information. The memory 1205 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1207 and instructions 1209 may be stored in the memory 1205. The instructions 1209 may be executable by the processor 1203 to implement the methods disclosed herein. Executing the instructions 1209 may involve the use of the data 1207 that is stored in the memory 1205. When the processor 1203 executes the instructions 1207, various portions of the instructions 1207a may be loaded onto the processor 1203, and various pieces of data 1209a may be loaded onto the processor 1203.

The wireless device 1201 may also include a transmitter 1211 and a receiver 1213 to allow transmission and reception of signals to and from the wireless device 1201. The transmitter 1211 and receiver 1213 may be collectively referred to as a transceiver 1215. An antenna 1217 may be electrically coupled to the transceiver 1215. The wireless device 1201 may also include multiple transmitters, multiple receivers, multiple transceivers and/or multiple antennas (not shown).

The various components of the wireless device 1201 may be coupled together by one or more buses, which may include a power bus, a control signal bus, a status signal bus, a data bus, etc. For the sake of clarity, the various buses are illustrated in FIG. 12 as a bus system 1219.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A wafer test probe for testing integrated circuitry on a die, comprising:
   a membrane core;
   circuitry within the membrane core, wherein the circuitry within the membrane core comprises at least one portion of an inductor, and wherein the circuitry within the membrane core simulates circuitry implemented in a non-semiconductor substrate that the die is configured for flip-chip mounting with; and
   a probe tip that establishes electrical contact between the membrane core and the integrated circuitry on the die.

2. The wafer test probe of claim 1, wherein the membrane core comprises a first layer of metal, a dielectric thin film, and a second layer of metal.

3. The wafer test probe of claim 2, wherein the circuitry within the membrane core is a transformer.

4. The wafer test probe of claim 3, wherein the first layer of metal is used to implement a first coil of the transformer and the second layer of metal is used to implement a second coil of the transformer.

5. The wafer test probe of claim 2, wherein the first layer of metal is connected to the probe tip.

6. The wafer test probe of claim 2, wherein the second layer of metal is connected to the probe tip through a via and the first layer of metal.

7. The wafer test probe of claim 1, wherein the probe tip establishes physical and electrical contact with the integrated circuitry on the die.

8. The wafer test probe of claim 1, wherein the circuitry comprises a transformer, and wherein wafer probe inductor trimming is used on the transformer to produce more accurate testing results.

9. The wafer test probe of claim 8, wherein the transformer is formed using a ladder structure.

10. The wafer test probe of claim 8, wherein the transformer is formed using a 45 degree ladder structure.

11. The wafer test probe of claim 1, wherein the wafer test probe is on a test head.

12. The wafer test probe of claim 11, wherein the test head is connected to test equipment.

13. The wafer test probe of claim 1, wherein the circuitry within the membrane core is used as part of the testing of the integrated circuitry.

14. A method for testing integrated circuitry on a die, the method comprising:
providing one or more wafer test probes, wherein at least one of the wafer test probes comprises a membrane core, wherein at least a portion of a transformer is implemented within the membrane core, and wherein the transformer simulates circuitry implemented in a non-semiconductor substrate that the die is configured for flip-chip mounting with;
applying a test head to the integrated circuitry on the die, wherein the test head comprises the one or more wafer test probes; and
testing the integrated circuitry using the one or more wafer test probes, wherein the wafer test probes establish electrical contact between the membrane core and the integrated circuitry on the die.

15. The method of claim 14, further comprising energizing the integrated circuitry using the one or more wafer test probes.

16. The method of claim 14, wherein applying the test head to the integrated circuitry on the die comprises establishing physical contact between a probe tip of a wafer test probe and the integrated circuitry.

17. The method of claim 14, wherein applying the test head to the integrated circuitry on the die comprises establishing electrical contact between a probe tip of a wafer test probe and the integrated circuitry.

18. The method of claim 14, wherein testing the integrated circuit using the one or more wafer test probes comprises applying electrical signals to the integrated circuitry, wherein the electrical signals pass through the integrated circuitry to the at least a portion of a transformer and back to the integrated circuitry.

19. The method of claim 14, wherein the membrane core comprises a first layer of metal, a dielectric thin film, and a second layer of metal.

20. The method of claim 19, wherein the first layer of metal is used to implement a first coil of the at least a portion of a transformer and the second layer of metal is used to implement a second coil of the at least a portion of a transformer.

21. The method of claim 19, wherein the first layer of metal is connected to a probe tip.

22. The method of claim 19, wherein the second layer of metal is connected to a probe tip through a via and the first layer of metal.

23. The method of claim 14, wherein wafer probe inductor trimming is used on the at least a portion of a transformer to produce more accurate testing results.

24. The method of claim 14, wherein the at least a portion of a transformer is formed using a ladder structure.

25. The method of claim 14, wherein the at least a portion of a transformer is formed using a 45 degree ladder structure.

26. The method of claim 14, wherein the test head is connected to test equipment.

27. An apparatus for testing integrated circuitry on a die, the apparatus comprising:
means for providing one or more wafer test probes, wherein at least one of the wafer test probes comprises a membrane core, wherein at least a portion of a transformer is implemented within the membrane core, and wherein the transformer simulates circuitry implemented in a non-semiconductor substrate that the die is configured for flip-chip mounting with;
means for applying a test head to the integrated circuitry on the die, wherein the test head comprises the one or more wafer test probes; and
means for testing the integrated circuit using the one or more wafer test probes, wherein the wafer test probes establish electrical contact between the membrane core and the integrated circuitry on the die.

28. The apparatus of claim 27, further comprising means for energizing the integrated circuit using the one or more wafer test probes.

29. The apparatus of claim 27, wherein the means for applying the test head to the integrated circuitry on the die comprises means for establishing physical contact between a probe tip of a wafer test probe and the integrated circuit.

30. The apparatus of claim 27, wherein the means for applying the test head to the integrated circuitry on the die comprises means for establishing electrical contact between a probe tip of a wafer test probe and the integrated circuit.

31. The apparatus of claim 27, wherein the means for testing the integrated circuit using the one or more wafer test probes comprises means for applying electrical signals to the integrated circuitry, wherein the electrical signals pass through the integrated circuitry to the transformer and back to the integrated circuitry.

32. The apparatus of claim 27, wherein the membrane core comprises a first layer of metal, a dielectric thinfilm, and a second layer of metal.

33. The apparatus of claim 32, wherein the first layer of metal is used to implement a first coil of the transformer and the second layer of metal is used to implement a second coil of the transformer.

* * * * *